United States Patent
Ting et al.

(10) Patent No.: US 6,399,508 B1
(45) Date of Patent: Jun. 4, 2002

(54) METHOD FOR METAL ETCH USING A DIELECTRIC HARD MASK

(75) Inventors: Chris Ting, Taoyuan; Janet Yu, Changhu, both of (TW)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/479,404

(22) Filed: Jan. 6, 2000

(30) Foreign Application Priority Data

Jan. 12, 1999 (TW) ........................................ 88100426 A

(51) Int. Cl.$^7$ ............................................ H10L 21/302
(52) U.S. Cl. .................. 438/706; 438/710; 438/712; 438/713; 438/720
(58) Field of Search ................................ 438/706, 710, 438/712, 720, 623, 624; 156/345

(56) References Cited

U.S. PATENT DOCUMENTS

| | | | |
|---|---|---|---|
| 5,001,085 A | 3/1991 | Cathey et al. | 437/245 |
| 5,217,570 A | 6/1993 | Kadomura | 156/665 |
| 5,254,217 A | 10/1993 | Maniar et al. | 156/656 |
| 5,316,974 A | 5/1994 | Crank | 437/190 |
| 5,468,342 A | 11/1995 | Nulty et al. | 156/643.1 |
| 5,502,007 A | 3/1996 | Murase | 437/225 |
| 5,700,737 A | 12/1997 | Yu et al. | 438/636 |
| 5,773,199 A | 6/1998 | Linliu et al. | 430/316 |
| 5,883,007 A * | 3/1999 | Abraham et al. | 438/714 |
| 5,886,410 A * | 3/1999 | Chiang et al. | 257/759 |
| 6,040,248 A | 3/2000 | Chen et al. | 438/725 |
| 6,043,163 A * | 3/2000 | Tsai et al. | 438/706 |
| 6,051,505 A | 4/2000 | Chu et al. | 438/710 |
| 6,114,250 A | 9/2000 | Ellingboe et al. | 438/709 |
| 6,177,353 B1 * | 1/2001 | Gutsche et al. | 438/704 |

FOREIGN PATENT DOCUMENTS

| | | | |
|---|---|---|---|
| TW | 350097 | 1/1999 | H01L/021/28 |

* cited by examiner

*Primary Examiner*—Benjamin L. Utech
*Assistant Examiner*—Lan Vinh
(74) *Attorney, Agent, or Firm*—Shirley L. Church; Kathi Bean; Joseph Bach

(57) ABSTRACT

The present disclosure provides a method for etching metal-comprising layers within a semiconductor structure using an inorganic dielectric hard masking layer. A typical stacked metal layer structure for practicing the method of the invention includes, from top to bottom, an inorganic dielectric hard masking layer, an anti-reflection (ARC) layer, a conductive layer, a diffusion barrier layer, and a dielectric layer, all deposited on a surface of a silicon substrate. When the inorganic dielectric hard masking layer is pattern etched, using an overlying photoresist mask, residual photoresist is removed prior to subsequent steps in which underlying metal-comprising layers are etched. The metal-comprising layers are then etched using a chlorine-based plasma, using the inorganic dielectric layer as a hard mask. The method of the invention provides good etch profile control without undesirable polymeric contamination. The selectivity for etching the underlying metal-comprising layers relative to the dielectric hard masking layer is at least 10:1. The higher selectivity ratio means that a thinner masking layer can be used, and etch resolution is improved.

13 Claims, 2 Drawing Sheets

METHOD FOR METAL ETCH USING A DIELECTRIC HARD MASK

BACKGROUND OF THE INVENTION

1. Field of the Invention

The present invention pertains to a method for etching conductive layers in a semiconductor structure. In particular, the present invention pertains to a method for etching conductive layers using an inorganic dielectric hard mask, as opposed to a conventional organic photoresist, in conjunction with a chlorine-based plasma.

2. Brief Description of the Background Art

In modern semiconductor processing, highly integrated circuit chips, such as a chip which is capable of performing the very fast logic operations required by a personal computer's central processing unit (CPU), have feature sizes in the range of about 0.25 $\mu$m or smaller. In the technology of semiconductor device fabrication, lithography (or photolithography) plays an import role in the continuing trend toward smaller device feature sizes. Lithography is a key technology in semiconductor manufacturing, because it is used repeatedly in a process sequence that depends on the device design. Progress in lithography techniques is reflected in more advanced (and smaller) devices.

Basic steps of the lithographic process include spin coating of the photoresist on a substrate, exposure, and development of a photoresist mask. In order to increase the resolution and reliability of a transferred pattern, a number of steps, including dehydration bake, priming, soft bake, and hard bake, are performed on the photoresist mask for the purpose of enhancing its primary function of precise pattern formation and protection of the substrate during etching.

Conventional optical photoresist materials include a resin, a sensitizer, and a solvent. The resin serves as a binder and establishes the mechanical properties of the film; the sensitizer is a photoactive compound; and the solvent serves to maintain the photoresist in a liquid state until it is applied to the substrate being processed. Since the properties of the resultant product are affected by the performance of an optical photoresist, it is very important to take into consideration the optical properties (such as resolution and photosensitivity) and the mechanical properties (such as adhesion, etch resistance, and thermal stability) of the photoresist.

The etching of metal or metal alloy films is a very important step in the fabrication of semiconductor devices, such as integrated circuits. On many of the most advanced devices, the device density is limited by the area occupied by the interconnect paths which form the conductivity of the device. The optical photoresist requires enhanced mechanical properties to withstand etching and implantation, as well as to increase the selectivity of etching the conductive material relative to the photoresist. The selectivity for etching the material to be etched relative to the photoresist typically ranges between about 2:1 and of about 40:1 (depending on the composition of the material to be etched). Typically, the selectivity for etching a conductive metal layer relative to a photoresist is within the range of about 2:1 and about 4:1. Thus, the photoresist layer must be about 0.25 to 0.5 times as thick as the conductive metal layer.

If an entire etch process is considered, the selectivity for etching film stack containing the conductive metal layer relative to the photoresist is only about 1:1. In other words, when a metal layer having a thickness of 5000 Å is to be etched, a photoresist mask having a thickness of at least 5000 Å is needed. The pattern transferred to the underlying metal layer will be affected if the photoresist mask is completely consumed during the etch process.

For many wet etch processes, selectivity for etching the conductive metal layer relative to the photoresist is very high; thus, the photoresist mask is not significantly affected. However, for dry etch processes, which are preferred from a process integration viewpoint, this is rarely the case. Thus, it is necessary to calculate the etch selectivities that a particular application will require, and only the masking material which meets the selectivity requirements of a dry etch process will be chosen.

From the standpoint of etch resistance and impurities encroachment, a thicker photoresist is preferable. However, the use of a thicker photoresist layer will negatively affect the accuracy of transferring a pattern to an underlying metal layer. A minimal thickness of photoresist is preferable to assure the best pattern transfer. Typically, the thickness of a conventional photoresist mask falls within the range of a few thousand Angstroms to 2 microns.

Mid-ultraviolet (UV) and deep UV technology offer a significant improvement in resolution because shorter wavelengths are utilized. Alternative radiation sources, such as X-ray and electron beam, have also been investigated, in an attempt to increase the resolution of the transferred pattern to fit the reduced size requirements of the next generation of semiconductor devices. Conventional photoresist materials are not appropriate for use with the new radiation sources and, therefore, new materials for masking must be developed. Nevertheless, conventional organic-based photoresists imaged using a mercury arc lamp to transmit a near-UV light source are capable of producing patterns on semiconductor substrates with feature sizes as small as about 0.8–1.5 $\mu$m. For submicron features, sidewall technology is typically used to further reduce the feature size.

As previously described, the selectivity of etching a conductive metal layer relative to a conventional photoresist material is less desired. In addition, the characteristics of interconnections are negatively affected when a thicker conductive line is required to further reduce the electrical interconnect delays. Resolution from photoresist to conductive layer remains a problem. Resolution is typically much better when a thinner photoresist layer is used.

Further, exposure of the organic-based photoresist mask during etching in a plasma reactor will result in deposition of polymer on adjacent film layers, thereby decreasing the etch rate of the conductive layer. Although controlled polymer deposition may be used during the anisotropic etching of interconnections, it is not desirable to have polymer deposition depend on the presence of a photoresist mask.

In summary, although all aspects of organic-based photoresist processing are well-understood, conventional organic-based photoresists provide minimal resolution for current device needs. Reliable integrated processes for the manufacture of tomorrow's smaller device feature sizes may not be practically achieved using conventional organic-based photoresist materials.

SUMMARY OF THE INVENTION

As described above, when conventional organic-based photoresists are used as masking layers in a plasma etching process for formation of conductive interconnections, the etch selectivity of the organic-based photoresists do not meet the resolution requirements of metal etching. As a result, the conductive interconnections formed have poor etch profiles. Further, polymeric species generated due to the exposure of the surface of the photoresist negatively affect the etching process. The method of the present invention utilizes an inorganic dielectric layer as a hard masking layer during metal etching.

A preferred embodiment of the invention relates to a method of pattern etching a stacked metal layer structure using an inorganic dielectric hard mask. A typical stacked metal layer structure for practicing the method of the invention includes, from top to bottom, an inorganic dielectric hard masking layer, an anti-reflection (ARC) layer, a conductive layer, a diffusion barrier layer, and a dielectric layer, all deposited on a surface of a silicon substrate. The dielectric hard masking layer preferably comprises a material selected from the group consisting of silicon dioxide, silicon oxynitride, phosphosilicate glass, borophosphosilicate glass, and silicon nitride. The ARC layer preferably comprises titanium nitride or silicon oxynitride. The conductive layer preferably comprises aluminum or an aluminum-copper alloy. The diffusion barrier layer is preferably titanium nitride.

Aluminum functions to interconnect the device structures formed in the substrate. Aluminum has emerged as the most important material for such applications due to its low resistivity. Aluminum alloys containing small quantities of copper are also often utilized in microelectronic applications. Titanium nitride functions as a diffusion barrier layer which prevents the diffusion and/or migration of substrate materials into the aluminum layer. Titanium nitride also serves as an anti-reflection coating (ARC) to enable better imaging of an overlying patterning layer.

In accordance with the first step of the method of the invention, the dielectric hard masking layer is pattern etched, typically using a fluorocarbon-based plasma. Typically, an organic-based photoresist layer (overlying the inorganic dielectric hard masking layer) is used to pattern the dielectric hard mask. Plasma etching techniques are preferably used to pattern etch the organic dielectric layer, since the pattern can be transferred from a photoresist to an inorganic dielectric layer with adequate selectivity.

After the inorganic dielectric hard masking layer has been pattern etched, the photoresist layer is removed (to avoid distortion of the pattern due to high temperature or polymeric contamination). In a subsequent optional step, residues generated during pattern etching of the dielectric hard masking layer are removed using a chlorine-based plasma in combination with $CHF_3$. The underlying silicon nitride ARC layer may be patterned using the same basic etch chemistry.

The inorganic dielectric layer is used as a hard mask for etching of the underlying stacked metal structure according to the following method: The underlying ARC layer is first etched using a plasma generated from a source gas comprising $Cl_2$, $BCl_3$, and $CHF_3$. The conductive layer (typically aluminum or aluminum alloy) and the underlying titanium nitride barrier layer are etched using a plasma generated from a source gas comprising chlorine, $BCl_3$, and nitrogen ($N_2$). Although the presence of nitrogen increases the rate of anisotropic etching, it results in the production of more residues. The residues may be removed by application of sufficient bias to the substrate during plasma etch of the conductive layer. An end point detector is used to terminate the etch process.

An overetch step is then performed using chlorine, $BCl_3$, $CHF_3$, and, optionally, nitrogen. The overetch step removes residues remaining from previous etching steps and more clearly defines the conductive interconnect lines.

The method of the invention utilizes an inorganic dielectric hard masking layer to perform etching of underlying metal-comprising layers in a semiconductor device. The use of a dielectric hard masking layer, as opposed to a conventional organic-based photoresist, provides good etch profile control, while avoiding undesirable polymeric contamination. The selectivity for etching the underlying metal-comprising layers relative to the dielectric hard masking layer is at least 10:1. The higher selectivity ratio means that a thinner dielectric hard masking layer can be used, and etch resolution is thereby improved.

DETAILED DESCRIPTION OF THE PREFERRED EMBODIMENTS

Regardless of whether the device is a simple metal oxide semiconductor (MOS) or a highly integrated complementary MOS semiconductor (CMOS), a typical semiconductor device typically consists of a gate electrode in the main body of an MOS, a drain, and a source, which is typically located adjacent the gate electrode. When millions of these devices are formed on a semiconductor substrate, the individual devices are connected to form a complete circuit using metallization techniques. Metallization techniques include the formation of interconnect layers.

The present invention pertains to the use of an inorganic dielectric layer as a hard mask for patterned etching of a conductive interconnect layer. When an inorganic dielectric hard mask is used in conjunction with the appropriate plasma source gas and a controlled bias power to direct the ion bombardment, high resolution interconnections are achieved.

Figure 1:
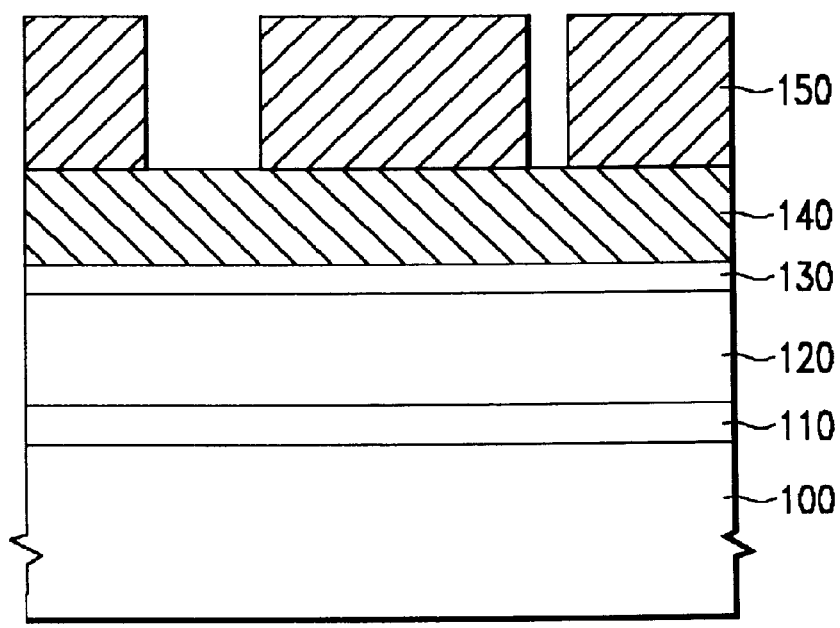
FIG. 1 shows a cross-sectional schematic of a beginning structure for performing the method of the invention. This structure typically includes, from top to bottom: a patterned photoresist layer 150, an inorganic dielectric hard masking layer 140, an ARC layer 130, a conductive layer 120, a diffusion barrier layer 110, and a dielectric layer 100, all deposited on a surface of a silicon substrate.

FIG. 1 shows a cross-sectional schematic of a beginning structure for performing the method of the invention. This structure typically includes, from bottom to top: a silicon substrate (not shown), a dielectric layer 100, a diffusion barrier layer 110, a conductive layer 120, an ARC layer 130, an inorganic dielectric hard masking layer 140, and a patterned photoresist layer 150. The dielectric layer 100 typically comprises a material selected from the group consisting of silicon dioxide, phosphosilicate glass (PSG), and borophosphosilicate glass (BPSG). For example and not by way of limitation, the dielectric layer 100 is typically deposited on the surface of the silicon substrate using a conventional chemical vapor deposition (CVD) technique, such as low pressure CVD (LPCVD) or plasma-enhanced CVD (PECVD). If the dielectric layer 100 comprises BPSG, it can be flowed at a substrate temperature within the range of about 850° C. and 950° C. to create a smoother surface topography, and thereby facilitate the step coverage of subsequently deposited film layers.

A diffusion barrier layer 110 is then deposited over the dielectric layer 100. The purpose of the diffusion barrier layer 110 is to prevent diffusion of substrate materials (such as silicon) into the conductive layer, in order to avoid junction spiking. If aluminum is used as the conductive material 120, the diffusion barrier layer 110 typically comprises titanium nitride, and typically has a thickness within the range of about 500 Å and about 1500 Å. For example and not by way of limitation, the diffusion barrier layer 110 is typically deposited using magnetic DC sputtering techniques, which can include reactive sputter deposition.

A layer 120 of a conductive material is then deposited to have a thickness within the range of about 2500 Å and about 25,000 Å over the diffusion barrier layer 110. Because of its low resistivity and adhesion properties, aluminum is commonly used to interconnect device structures formed in the silicon substrate. Aluminum alloys containing approximately 0.5 wt % copper are often utilized to avoid junction spiking and to improve the electrical properties of the interconnect layer. For example and not by way of limitation, aluminum alloys can be deposited using magnetic DC sputtering techniques.

An ARC layer 130 is then deposited over the conductive layer 120. The ARC layer 130, which typically comprises titanium nitride or silicon oxynitride, enables better imaging of the underlying conductive layer 120. The ARC layer is typically deposited to have a thickness within the range of about 250 Å and about 1000 Å.

Subsequently, a layer 140 of an inorganic dielectric material is deposited to have a thickness within the range of about 1000 Å and about 3000 Å over the ARC layer 130. The dielectric layer 140 typically comprises a silicon oxide-containing material, such as silicon dioxide, silicon oxynitride, phosphosilicate glass (PSG), and borophosphosilicate glass (BPSG), or may comprise a nitride-containing material, such as silicon nitride, or other suitable inorganic dielectric material. For example and not by way of limitation, the inorganic dielectric layer 140 is typically deposited using a CVD technique or a thermal oxidation method. Under some circumstances, the ARC layer 130 and the inorganic dielectric layer 140 may comprise the same material (such as silicon oxynitride), in which case, these two layers are deposited as a single layer.

A patterned photoresist layer 150 is typically used for patterning the inorganic dielectric layer 140, which will be used as a hard masking layer in subsequent etching steps. The patterned photoresist layer 150 may be any suitable photoresist material patterned using techniques known in the art. Patterning of the photoresist 150 will depend on the particular photoresist material used.

Figure 2:
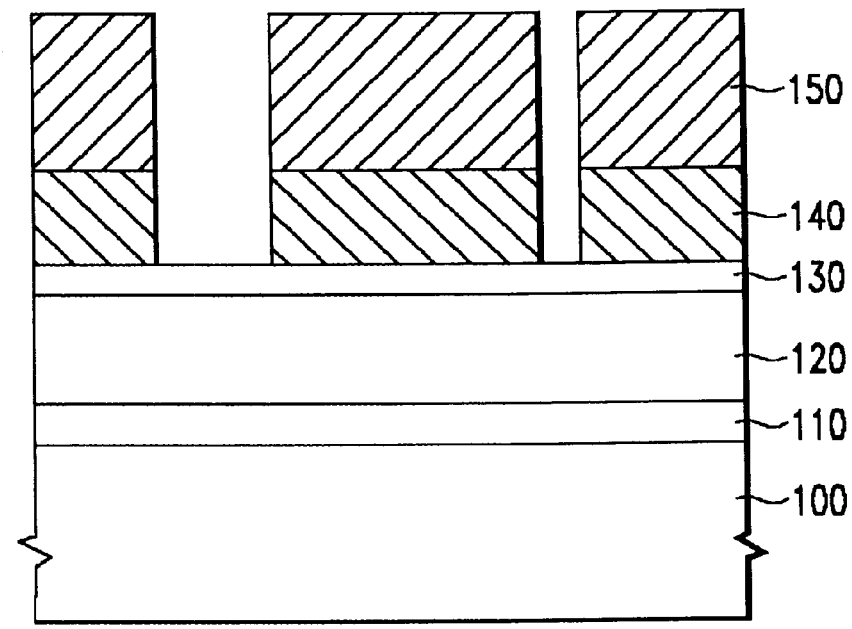
FIG. 2 shows the structure of FIG. 1 after pattern etching the inorganic dielectric hard masking layer 140 to form a hard masking layer. An upper surface of ARC layer 130 is exposed during pattern etching of hard masking layer 140.

Referring to FIG. 2, the inorganic dielectric layer 140 is pattern etched, exposing an upper surface of the underlying ARC layer 130. For example and not by way of limitation, the inorganic dielectric layer 140 is typically pattern etched using a plasma etching technique. This dry etch method typically applies both physical bombardment and chemical reactions to accomplish etching. By adding a physical bombardment component to chemically reactive etching, the shortcomings of both processes can be surmounted. Dry etching techniques offer the potential of controlled anisotropic etching, together with adequate etch selectivity. A fluorocarbon-based plasma is typically used to pattern etch the dielectric layer 140.

Figure 3:
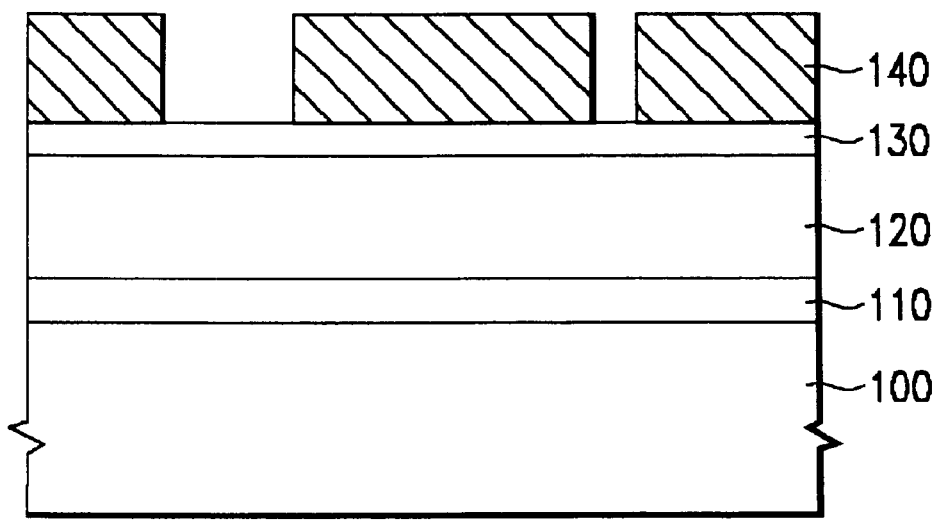
FIG. 3 shows the structure of FIG. 2 after removal of photoresist layer 150.

After the dielectric layer 140 has been pattern etched, the photoresist layer 150 is then removed, as shown in FIG. 3. The photoresist is typically removed using conventional wet etch or dry etch methods known in the art. The main objective is to ensure that all of the photoresist is removed as quickly as possible without inadvertently etching any of the underlying layers of the semiconductor structure.

Figure 4:
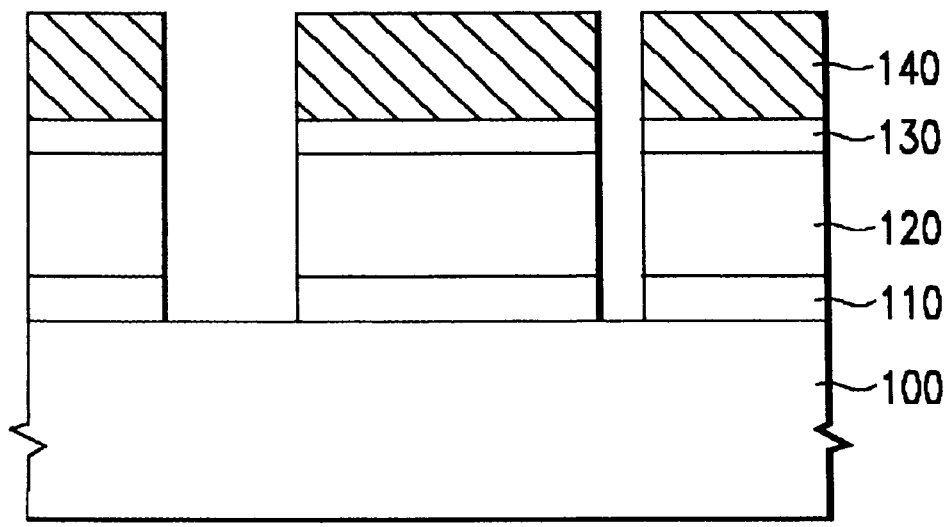
FIG. 4 shows the structure of FIG. 3 after etching of ARC layer 130, conductive layer 120, and diffusion barrier layer 110.

Following removal of the photoresist layer 140, the underlying metal-comprising layers 130, 120, and 110 are etched, using the inorganic dielectric layer 140 as a hard mask, as shown in FIG. 4. In the first step of the etching process, a combination of chlorine and $CHF_3$ is used to fully open the inorganic dielectric hard masking layer and to remove residues generated during pattern etching of the dielectric hard masking layer. Typical gas flow rates during this step of the etching process are approximately 90 sccm $Cl_2$ and 0–50 sccm (typically, 10 sccm) $CHF_3$. Typical etch process conditions during the first step of the etching process are as follows: 8 mT process chamber pressure, 1400 W source power, 80 W substrate bias power, and 40° C. substrate temperature.

The ARC layer 130 is then etched using a plasma generated from a source gas containing chlorine, $BCl_3$, and $CHF_3$. $BCl_3$ is the preferred source gas for native oxide removal. The chlorine ions also assist in ion bombardment and enhance the anisotropic etching. Typical gas flow rates during etching of the ARC layer are approximately 50 sccm $Cl_2$, 50 sccm $BCl_3$, and 5 sccm $CHF_3$. Typical etch process conditions during etching of the ARC layer 130 are as follows: 6 mTorr process chamber pressure, 800 W source power, 200 W substrate bias power, and 40° C. substrate temperature.

Subsequently, the main aluminum etch is performed using a plasma source gas containing chlorine, $BCl_3$, and nitrogen. The chlorine-based plasma (i.e., the combination of $Cl_2$ and $BCl_3$) promotes anisotropic etching, and the addition of nitrogen to the feed gas further improves the anisotropic etching by coating the sidewalls of the aluminum with a protective, passivating film. Typical gas flow rates during the main aluminum etch are approximately 100 sccm $Cl_2$, 20 sccm $BCl_3$, and 0–50 sccm (typically, 20 sccm) $N_2$. Typical etch process conditions during etching of the aluminum layer 120 are as follows: 7 mTorr process chamber pressure, 800 W source power, 200 W substrate bias power, and 40° C. substrate temperature.

While the introduction of nitrogen provides good profile control during the etch of the metal-comprising layers, which include the aluminum layer 120 and the underlying diffusion barrier layer 110, it also results in the generation of undesired residues. To solve this problem, a higher substrate bias is preferred. A bias power within the range of about 100 W and about 300 W is preferred during the aluminum etch step.

The use of a higher substrate bias may introduce another problem, that is, dielectric hard mask rounding. Dielectric hard mask rounding results in unpredictable profile control during aluminum etching, which may affect the electrical properties of the resulting semiconductor device. One skilled in the art can adjust the amount of substrate bias to suit a particular application.

An end point detector is typically used to detect completion of the aluminum etch.

An optional final step (not shown in the figures) may be used to remove residues remaining from previous etching steps and to more clearly define the conductive interconnect lines. Since this step results in a transfer of the pattern into the dielectric layer underlying the barrier layer, it is often referred to as an "overetch" step. Overetch is performed using a plasma source gas containing chlorine, $BCl_3$, $CHF_3$, and, optionally, nitrogen. The nitrogen flow may be turned off during this step, since the primary function of nitrogen is accomplished during the main aluminum etch. Typical gas flow rates during the overetch step are approximately 100 sccm $Cl_2$, 20 sccm $BCl_3$, 0–50 sccm $CHF_3$, and 0–50 sccm (typically, 20 sccm) $N_2$. Typical etch process conditions during the overetch step are as follows: 7 mTorr process chamber pressure, 800 W source power, 150 W substrate bias power, and 40° C. substrate temperature.

With the trend toward smaller feature sizes, anisotropic etching of the conductive interconnections becomes very important. The selectivity of etching the metal-comprising layers relative to an organic-based photoresist is too low to provide good profile control during etching of high aspect ratio conductive lines.

According to the method of the present invention, an inorganic dielectric layer is used as a hard mask to pattern etch the metal layers. Using the inorganic dielectric hard masking layer in conjunction with a nitrogen-containing feed gas, anisotropic etching of the conductive lines can be achieved. The selectivity for etching the underlying metal-comprising layers relative to the dielectric hard masking layer is at least 10:1. The higher selectivity ratio means that a thinner dielectric hard masking layer can be used, and etch resolution is thereby improved. Furthermore, the use of a dielectric hard masking layer (in lieu of an organic photoresist) provides a polymer-free environment, resulting in decreased contamination of the etched film layers.

The above-described preferred embodiments are not intended to limit the scope of the present invention, as one skilled in the art can, in view of the present disclosure expand such embodiments to correspond with the subject matter of the invention claimed below.

We claim:

1. A method for etching a conductive layer on a semiconductor structure, wherein said semiconductor structure includes, from top to bottom, a patterned photoresist layer, an inorganic dielectric hard masking layer, at least one conductive layer, and a dielectric layer, all deposited on a surface of a semiconductor substrate, wherein said method comprises the steps of:

a) pattern etching said dielectric hard masking layer through said patterned photoresist layer, using a plasma generated from a fluorocarbon-comprising gas, whereby an upper surface of said conductive layer is exposed through said patterned hard masking layer; followed by b) removing residual patterned photoresist material; followed by c) etching said semiconductor structure using a plasma generated from a source gas comprising chlorine and $CHF_3$, whereby residues generated during pattern etching of said dielectric hard masking layer are removed; followed by d) etching said at least one conductive layer using a plasma generated from a source gas consisting essentially of nitrogen and a source for chlorine species.

2. The method of claim 1, wherein said dielectric hard masking layer comprises a material selected from the group consisting of: silicon dioxide, silicon oxynitride, phosphosilicate glass, borophosphosilicate glass, and silicon nitride.

3. The method of claim 1, wherein said dielectric hard masking layer is deposited using a chemical vapor deposition technique or a thermal oxidation method.

4. The method of claim 1, wherein the etch rate of said conductive layer is at least 10 times greater than the etch rate of said dielectric hard masking layer in step d).

5. The method of claim 1, wherein said semiconductor structure further includes an ARC layer between said dielectric hard masking layer and said conductive layer.

6. The method of claim 5, wherein said ARC layer is selected from the group consisting of titanium nitride and silicon oxynitride, and wherein said ARC layer is etched using a plasma generated from a source gas comprising $Cl_2$, $BCl_3$, and $CHF_3$, prior to etching said conductive layer.

7. The method of claim 1, wherein said conductive layer comprises aluminum or aluminum-copper alloy.

8. The method of claim 7, wherein said conductive layer is etched using a plasma generated from a source gas comprising $Cl_2$, $BCl_3$, and $N_2$.

9. The method of claim 1, wherein said semiconductor structure further includes a diffusion barrier layer between said conductive layer and said semiconductor substrate.

10. The method of claim 9, wherein said diffusion barrier layer comprises titanium nitride, and wherein said diffusion barrier is etched using a plasma generated from a source gas comprising $Cl_2$, $BCl_3$, and $CHF_3$.

11. The method of claim 9, wherein said diffusion barrier layer is etched during step d), whereby an upper surface of said semiconductor substrate is exposed.

12. The method of claim 1, wherein said method further comprises an overetch step e), which is performed after step d):

e) etching said semiconductor structure using a plasma generated from a source gas comprising $Cl_2$, $BCl_3$, and $CHF_3$.

13. The method of claim 12, wherein said source gas used for etching said semiconductor structure in step e) further comprises nitrogen.

* * * * *